United States Patent
Yanagida (10) Patent No.: US 7,219,823 B2
(45) Date of Patent: May 22, 2007

(54) ELECTRONIC COMPONENT FEEDING DEVICE AND ELECTRONIC COMPONENT COUNTING APPARATUS HAVING THE SAME

(75) Inventor: Tsutomu Yanagida, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 215 days.

(21) Appl. No.: 10/878,680

(22) Filed: Jun. 29, 2004

(65) Prior Publication Data

US 2005/0011926 A1     Jan. 20, 2005

(30) Foreign Application Priority Data

Jun. 30, 2003   (JP)   ............... 2003-187236

(51) Int. Cl.
*H05K 13/02* (2006.01)
(52) U.S. Cl. ........................... 226/76; 414/411
(58) Field of Classification Search ............... 226/2, 226/6, 8, 27, 32, 45, 76, 134, 136, 141; 242/564.4; 221/25, 71, 79, 87, 88, 211; 414/403, 752.1, 414/411, 412; 29/740, 743; 700/117, 213, 700/231, 244; 156/584; 400/616, 616.2, 400/616.3
See application file for complete search history.

(56) References Cited

U.S. PATENT DOCUMENTS

| 4,115,683 | A | * | 9/1978 | Clark et al. ............... 219/121.7 |
| 5,024,720 | A | * | 6/1991 | Boss et al. .................... 156/584 |
| 5,548,364 | A | * | 8/1996 | Muramatsu et al. ............ 396/6 |

| 2003/0051344 | A1 | 3/2003 | Terui |
| 2003/0072644 | A1 | 4/2003 | Yamamura et al. |

FOREIGN PATENT DOCUMENTS

| JP | 10-041686 | 2/1998 |
| WO | WO-02/080643 | 10/2002 |

OTHER PUBLICATIONS

European Search Report mailed on Nov. 7, 2005, directed to EP Application No. 04015353.8.

* cited by examiner

*Primary Examiner*—William A. Rivera
*Assistant Examiner*—Scott Haugland
(74) *Attorney, Agent, or Firm*—Morrison & Foerster LLP (57) ABSTRACT

This invention provides a low-cost electronic component feeding device which stabilizes a pickup position of an electronic component and does not require a highly accurate sprocket. A component feeding unit is fixed to an adjusting jig, a recognition camera moves to a component pickup position and takes an image of each of feeding teeth formed around a sprocket, and a recognition processing portion performs recognition processing and calculates a position of each of the feeding teeth. In this case, for each of the numbers corresponding to the feeding teeth checked through a checking window, positional data of each of the feeding teeth which are a recognition processing result of the recognition processing portion are stored in a memory by using an input device. After such an adjusting operation of the component feeding units is completed, the component feeding units each mounted with a storage tape are fixed to the electronic component mounting apparatus. Then, an XY stage is driven to move a head unit to the component feeding unit, and the CPU corrects a pickup position of a suction nozzle based on the positional data.

2 Claims, 12 Drawing Sheets

ELECTRONIC COMPONENT FEEDING DEVICE AND ELECTRONIC COMPONENT COUNTING APPARATUS HAVING THE SAME

CROSS-REFERENCE OF THE INVENTION

This invention is based on Japanese Patent Application No. 2003-187236, the content of which is incorporated by reference in its entirety.

BACKGROUND OF THE INVENTION

1. Field of the Invention

This invention relates to an electronic component feeding device feeding an electronic component to a component pickup position by intermittently feeding a storage tape stored with the electronic component in its storage portion by engaging feeding holes provided in the storage tape at predetermined pitches and feeding teeth provided around a sprocket, and an electronic component mounting apparatus provided with the electronic component feeding device.

2. Description of the Related Art

The electronic component feeding device of this type is disclosed in the Japanese Patent Application Publication No. 10-41686. Generally, when feeding a micro-sized chip component, a pickup position need be stabilized by supplying and positioning the storage tape with high accuracy. However, conventionally, the stabilization of the pickup position has been made only by accurate manufacturing of a sprocket.

Therefore, when the storage tape can not be positioned with predetermined accuracy, the sprocket has been replaced by the sprocket which can satisfy the predetermined accuracy. This requires highly accurate sprockets, which cost much and take much time for adjustment to the electronic component feeding device.

SUMMARY OF THE INVENTION

This invention is directed to a low-cost electronic component feeding device in which a pickup position of an electronic component is stabilized and a highly accurate sprocket is not required, and an electronic component mounting apparatus provided with such an electronic component feeding device.

The invention provides an electronic component feeding device feeding an electronic component stored in a storage tape to a position where the electronic component is picked up by a suction nozzle. The device includes a sprocket having a plurality of feeding teeth provided at a peripheral portion thereof, a motor intermittently rotating the sprocket so that each of the feeding teeth sequentially engages with a corresponding hole provided in the storage tape, and a memory storing positional data of the feeding teeth of the sprocket.

The invention also provides an electronic component mounting apparatus including an electronic component feeding device feeding an electronic component to a component feeding position, and comprising a sprocket which intermittently rotates so that a plurality of feeding teeth provided at a peripheral portion thereof engage sequentially with a plurality of feeding holes provided in a storage tape storing the electronic component therein. The apparatus also includes a memory storing positional data of the feeding teeth resting at the component feeding position in association with feeding tooth identification data correlating each of the feeding teeth to corresponding portion of the positional data, and a control device correcting a position where the electronic component is picked up by a suction nozzle based on the positional data and the feeding tooth identification data.

DETAILED DESCRIPTION OF THE INVENTION

An electronic component mounting apparatus having an electronic component feeding device of one embodiment of the invention will be described with reference to the drawings. This electronic component mounting apparatus is a so-called multifunctional chip mounter, which can mount a variety of electronic components A on a printed board P.

Figure 1:
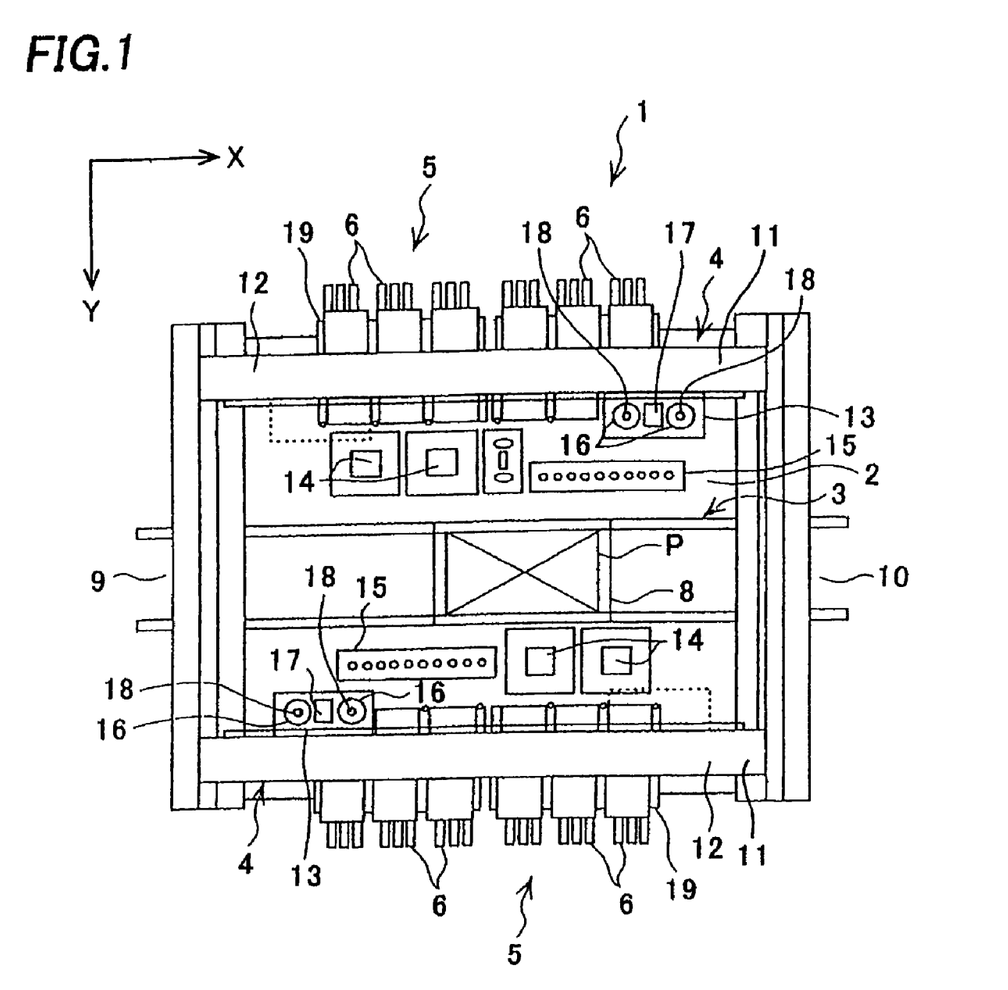
FIG. 1 is a plan view of an electronic component mounting apparatus of an embodiment of the invention.

FIG. 1 is a plan view of the electronic component mounting apparatus. An electronic component mounting apparatus 1 includes a base 2, a conveyer portion 3 extending in a lateral direction in a center of the base 2, and two component mounting portions 4 and two component feeding portions 5 each provided on the front (on a lower side of FIG. 1) and the rear (on an upper side of FIG. 1) of the base 2. Each of the component feeding portions 5 is detachably set with a plurality of component feeding units 6 as the electronic component feeding device.

The conveyer portion 3 includes a central set table 8, a left feeding conveyer 9, and a right discharging conveyer 10. The printed board P is supplied from the feeding conveyer 9 to the set table 8, and is fixed at a predetermined height so as to be mounted with electronic components. After completing the electronic component mounting, the printed board P is discharged from the set table 8 to a downstream device through the discharging conveyer 10.

Each of the component mounting portions 4 is provided with an XY stage 12 movably mounted with a head unit 13, a component recognition camera 14, and a nozzle stocker 15. The head unit 13 is mounted with two mounting heads 16 for picking up and mounting the electronic components, and a board recognition camera 17 for recognizing the printed board P. Normally, the XY stages 12 of both the component mounting portions 4 are alternately driven.

In each of the XY stages 12, a beam 11 moves in a Y direction driven by a Y axis motor 12A, and the head unit 13 moves along this beam 11 in an X direction driven by an X axis motor 12B. Therefore, the head unit 13 moves in the X and Y directions.

In each of the component feeding portions 5, many component feeding units 6 are laterally and detachably aligned on a unit base 19. Each of the component feeding units 6 is provided with a storage tape C storing many electronic components aligned at predetermined pitches, which will be described below. By intermittently feeding the storage tape C, the electronic components are fed one by one from an end of the component feeding unit 6 to the component mounting portion 4. In this electronic component mounting apparatus 1, a relatively small electronic component such as a surface mounting component is mainly fed from the component feeding unit 6, and a relatively large electronic component is fed from a tray-type component feeding device (not shown).

This electronic component mounting apparatus 1 is driven based on NC data stored in a storage portion thereof. First, the XY stage 12 is driven, the head unit 13 moves to the component feeding unit 6, and then the mounting head 16 lowers to pick a required electronic component up by a suction nozzle 18 thereof. Then, the mounting head 16 rises up, and the XY stage 12 is driven to move the electronic component to a position right above the component recognition camera 14. The component recognition camera 14 recognizes a posture and a position of the electronic component on the suction nozzle 18. Next, the head unit 13 moves to above the printed board P on the set table 8, and the board recognition camera 17 recognizes a position of the printed board P. Then, an X axis motor 12B and a Y axis motor 12A of the XY stage 12, and a θ axis motor 18A of the suction nozzle 18 operate to correct the position of the electronic component by an amount based on a recognition result of the component recognition camera 14 and the board recognition camera 17, a Z axis motor 18B is driven to lower the suction nozzle 18, and then the electronic component A is mounted on the printed board P.

The XY stage 12 of this embodiment is mounted with two mounting heads 16 (suction nozzles 18) so that two electronic components can be sequentially picked up and sequentially mounted on the printed board P. Furthermore, when the mounting head 16 has more than two suction nozzles 18, although not shown, more than two electronic components can be sequentially picked up and sequentially mounted on the printed board P.

Figure 2:
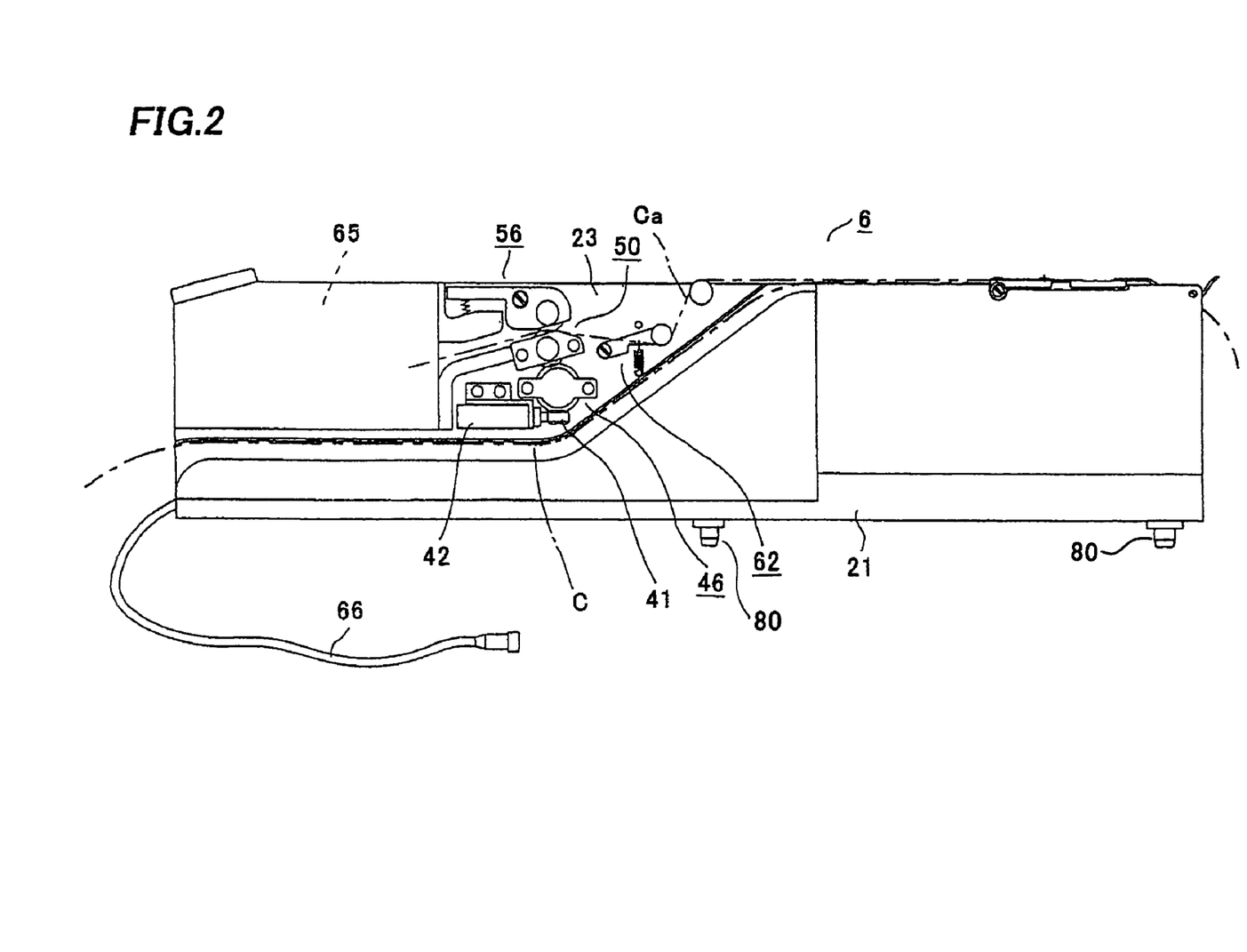
FIG. 2 is a side view of a component feeding unit of the apparatus of FIG. 1.

Next, the component feeding unit 6 will be described based on FIGS. 2 and 3. The component feeding unit 6 can employ, for example, four types of the storage tapes C, i.e., the storage tapes of 16 mm width storing electronic components aligned at 4 mm pitches, 8 mm pitches, 12 mm pitches and 16 mm pitches. The component feeding unit 6 includes a unit frame 21, a storage tape reel (not shown) rotatably mounted on the unit frame 21, a tape feeding system 22 for intermittently feeding the storage tape C let out from the storage tape reel reeled with the storage tape C to a position where the electronic component A is picked up by the suction nozzle 18, a cover tape peeling system 23 for peeling a cover tape Ca from the storage tape C just before the pickup position, and a shutter system 24 which enables picking-up of the electronic component A by opening above the electronic component A fed to the pickup position.

The storage tape C let out from the storage tape reel is fed to the pickup position under a suppressor 27 (shown in FIGS. 8 and 9) which is provided just before the pickup position in a tape route. This suppressor 27 is formed with an opening 27A for picking, and integrated with a shutter 77 of the shutter system 24, which will be described below, near the opening 27A. The suppressor 27 is formed with a slit 28 on one side of the shutter 77. The cover tape Ca of the storage tape C is peeled off at the slit 28, and stored in a storage portion 65 of the cover tape peeling system 23, which will be described below. That is, the electronic component A stored in the storage tape C is fed to a position under the shutter 77, which opens and closes the opening 27A for picking, with the cover tape Ca being peeled off.

Figure 3:
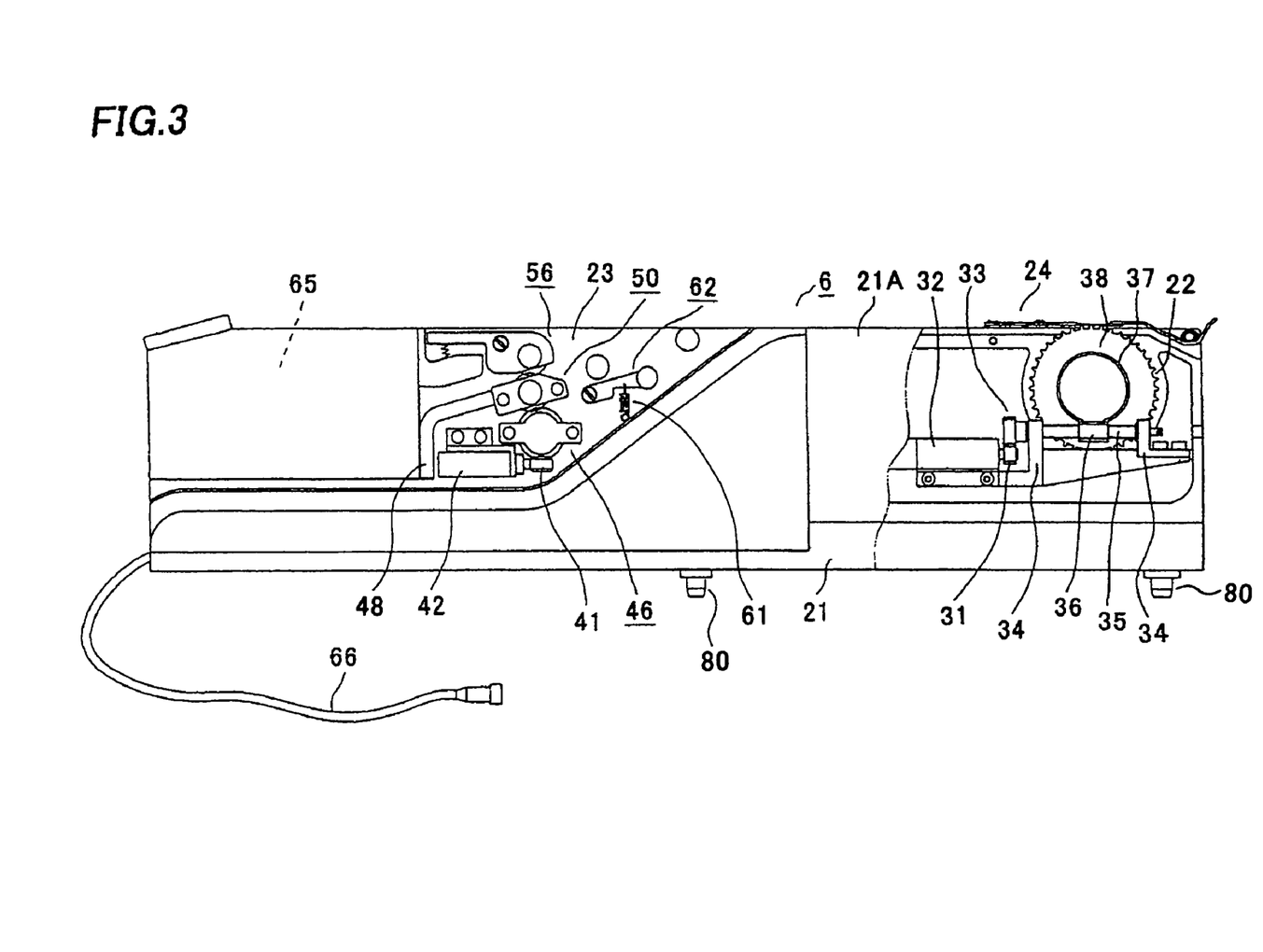
FIG. 3 is a partial side view of the component feeding unit of the apparatus of FIG. 1.

As shown in FIG. 3, the tape feeding system 22 includes a drive motor 32 provided with a gear 31 at its output axis, a rotation axis 35 rotatably supported by both supporting bodies 34 and provided with a gear 33 at its end engaged with the gear 31, and a sprocket 38 provided with a worm wheel 37 engaged with a worm gear 36 provided in a center of the rotation axis 35 and also engaged with feed holes Cb formed in the storage tape C at predetermined pitches to feed the storage tape C. Therefore, when the drive motor 32 is driven, the rotation axis 35 rotates through the gear 31 and the gear 33, and the sprocket 38 intermittently rotates by a predetermined angle through the worm gear 36 and the worm wheel 37. Then, the storage tape C is intermittently fed by the feed holes Cb.

Figure 4:
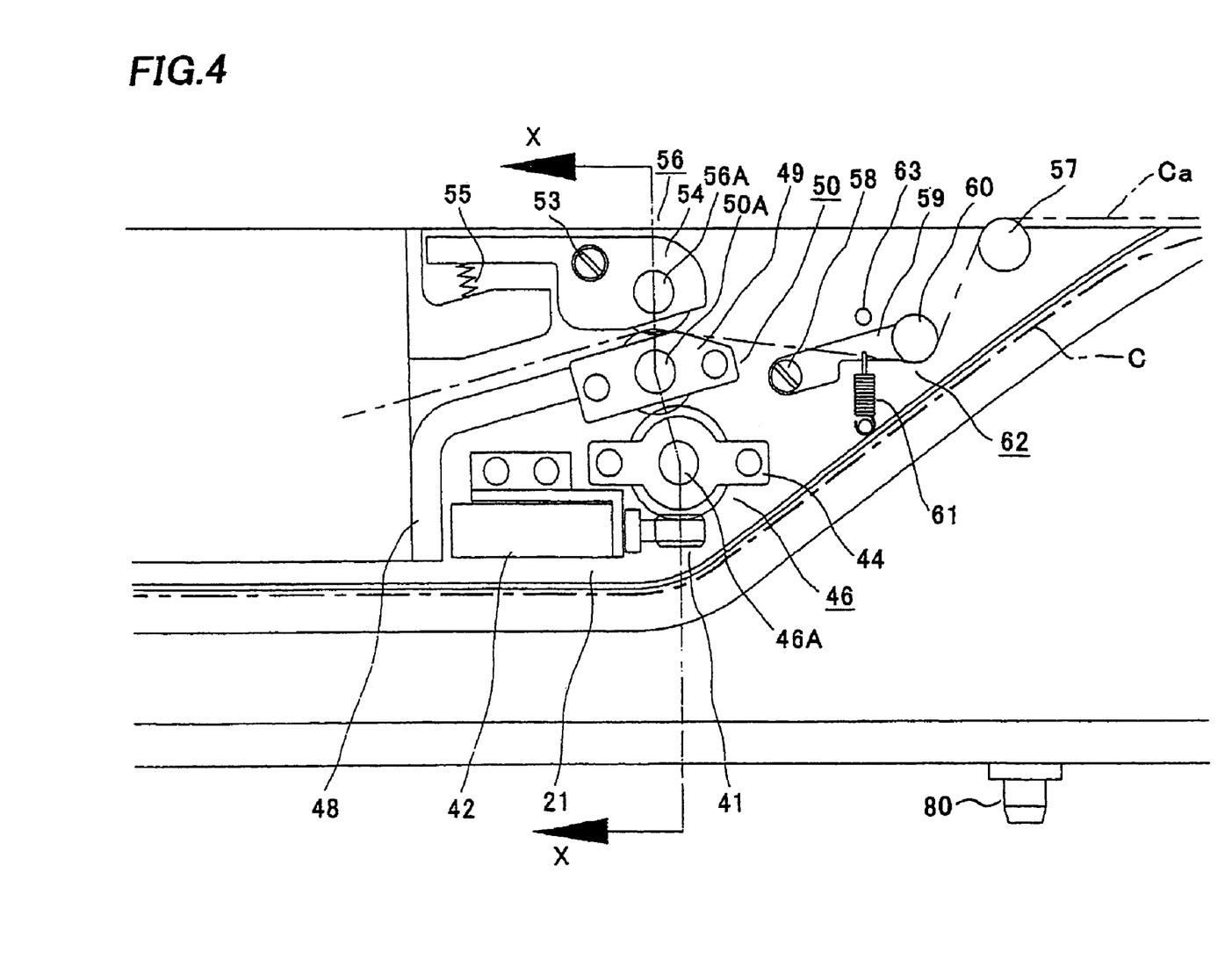
FIG. 4 is an enlarged view of a cover tape peeling system of the apparatus of FIG. 1.
Figure 5:
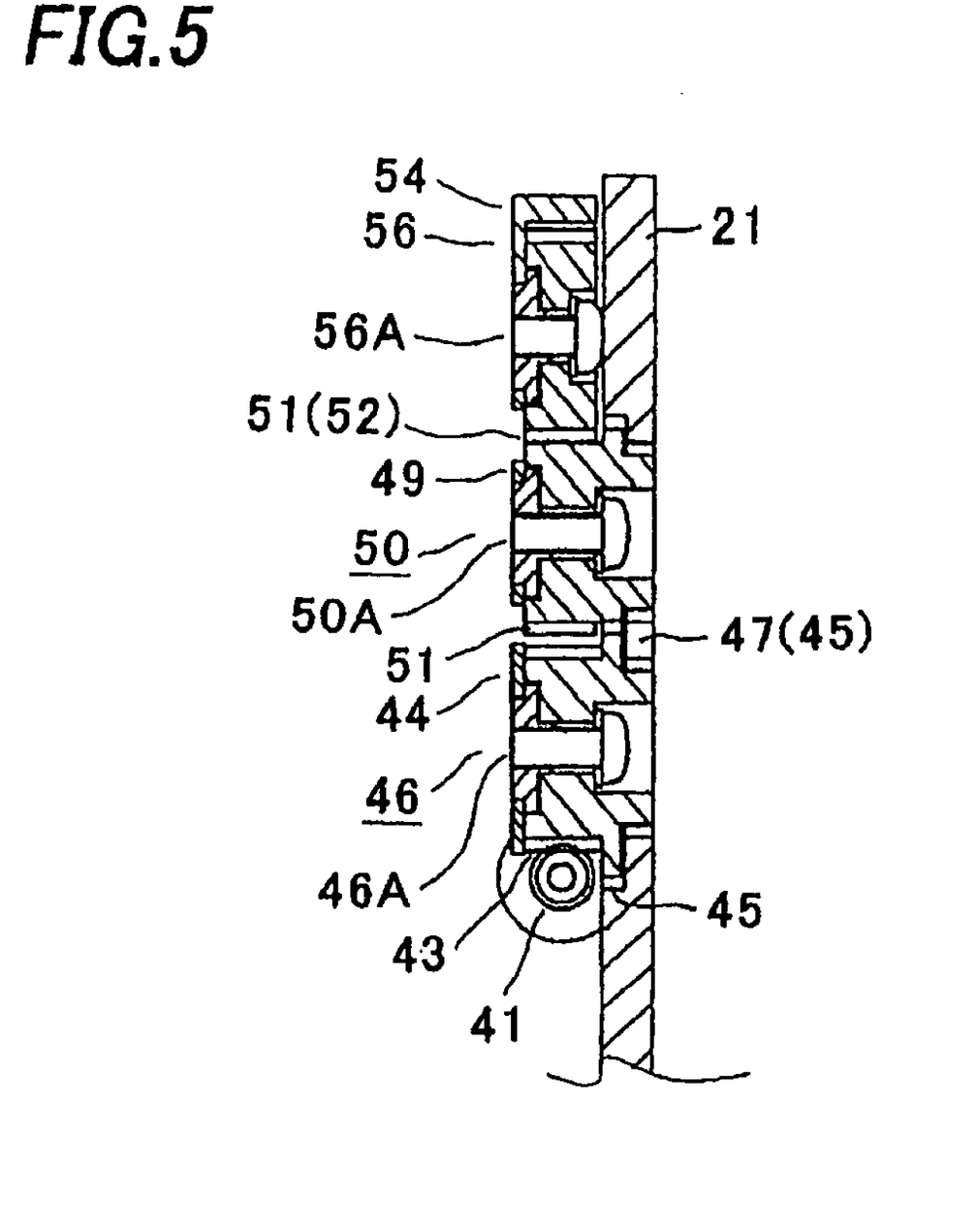
FIG. 5 is a cross-sectional view along line X—X of FIG. 4.

As shown in FIGS. 3 to 5, the cover tape peeling system 23 includes a drive motor 42, a first rotating body 46, a second rotating body 50, a third rotating body 56, a roller 57, and a tension applying body 62. The drive motor 42 is provided with a worm gear 41 at its output axis. The first rotating body 46 is provided with a gear 43 engaged with a gear 45 and the gear 41 therearound, and is rotatably supported by a supporting body 44 through a support axis 46A, the supporting body 44 being fixed on the unit frame 21. The second rotating body 50 is provided with a gear 47 engaged with a contact portion 51 and the gear 45 therearound, and is rotatably supported by a supporting body 49 through a support axis 50A, the supporting body 49 being fixed on the unit frame 21 through an attachment body 48. The third rotating body 56 is provided with a contact portion 52 contacting with the contact portion 51 being pushed by a spring 55 therearound, and is rotatably supported by an attachment body 54 through a support axis 56A, the attachment body 54 being fixed on the unit frame 21 and rotatable through a support axis 53. The roller 57 is provided for guiding the cover tape Ca. The tension applying body 62 is provided with a roller 60 for guiding the cover tape Ca guided by the roller 57 on an end of an attachment body 59, the attachment body 59 being fixed on the unit frame 21 and rotatable around a support axis 58, and applies tension to the cover tape Ca being pushed by a spring 61. A numeral 63 designates a stopper for limiting rotation of the attachment body 59 there.

When the cover tape Ca is peeled off, the drive motor 42 is driven to rotate the first rotating body 46 through the worm gear 41 and the gear 43. By the rotation of the first rotating body 46, the second rotating body 50 rotates through the gears 45 and 47. By rotation of the second rotating body 50, the third rotating body 56 rotates with the cover tape Ca being interposed between the contact portions 52 and 51 pushed by the spring 55. Then, the cover tape Ca is peeled from the storage tape C by a pitch at the slit 28 of the suppressor 27 without generating the slack, and is stored in a storage portion 65 provided in an end of the component feeding unit 6.

Figure 6:
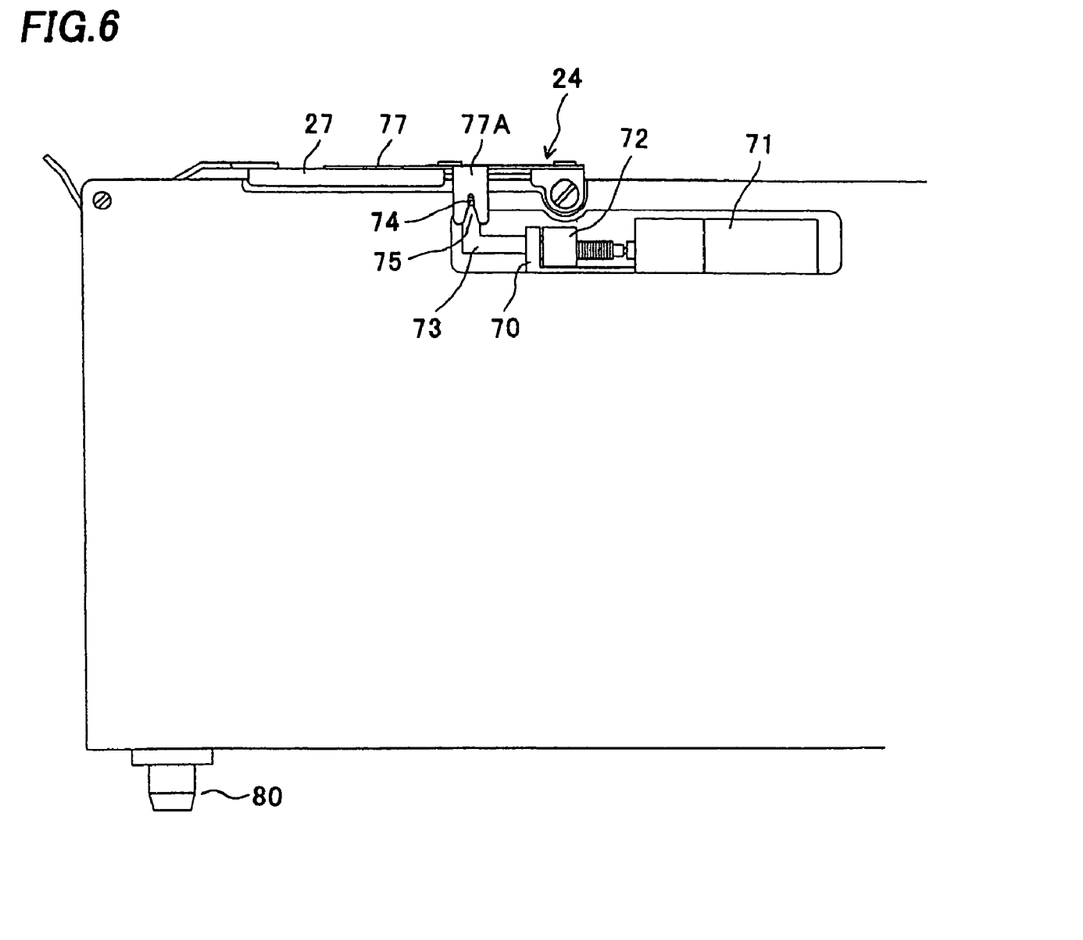
FIG. 6 is a side view of a shutter system of the component feeding unit of FIG. 2 when a shutter is closed.
Figure 7:
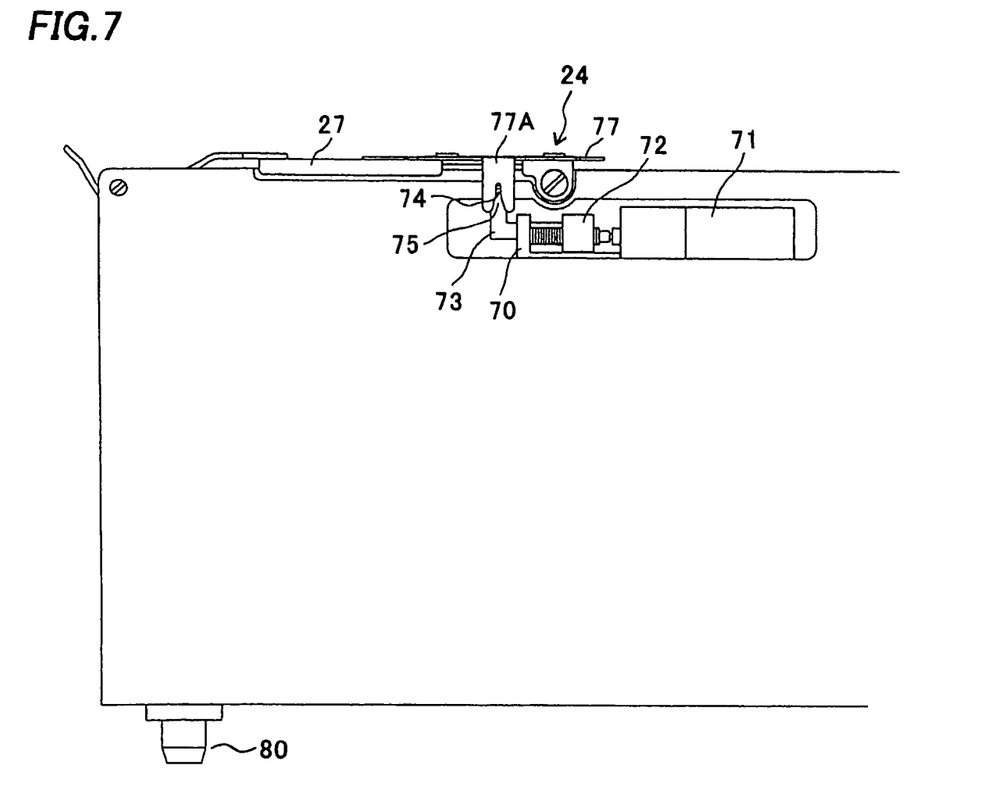
FIG. 7 is a side view of the shutter system of FIG. 6 when the shutter is open.

As shown in FIGS. 6 and 7, the shutter system 24 includes a drive motor 71 having an output axis as a screw axis supported by a supporting body 70 at its end, an operation body 73 fixed to a nut body 72 engaged with the screw axis, and a shutter 77 slidably provided on the suppressor 27. The shutter 77 has a bending piece 77A formed with a groove 75 to be fit with a pin 74 protruding from the operation body 73, and has a fitting piece 76 fitted in a guide groove 27B provided in the suppressor 27, being slidable on the suppressor 27. For opening or closing the opening 27A for picking by shifting the shutter 77, the drive motor 71 is driven to shift the nut body 72 engaged with the screw axis and the operation body 73, and then shift the fitting piece 76 along the guide groove 27B, so that the shutter 77 shifts to open or close the opening 27A.

When the shutter 77 is shifted to a closing position (FIG. 8), the shutter 77 closes the opening 27A, preventing the electronic component A fed to the pickup position from jumping out of the storage portion D of the storage tape C which the cover tape Ca is peeled from. When shifted to an opening position (FIG. 9), the shutter 77 recedes from above the electronic component A to enable picking of the component A by the suction nozzle 18.

Figure 8:
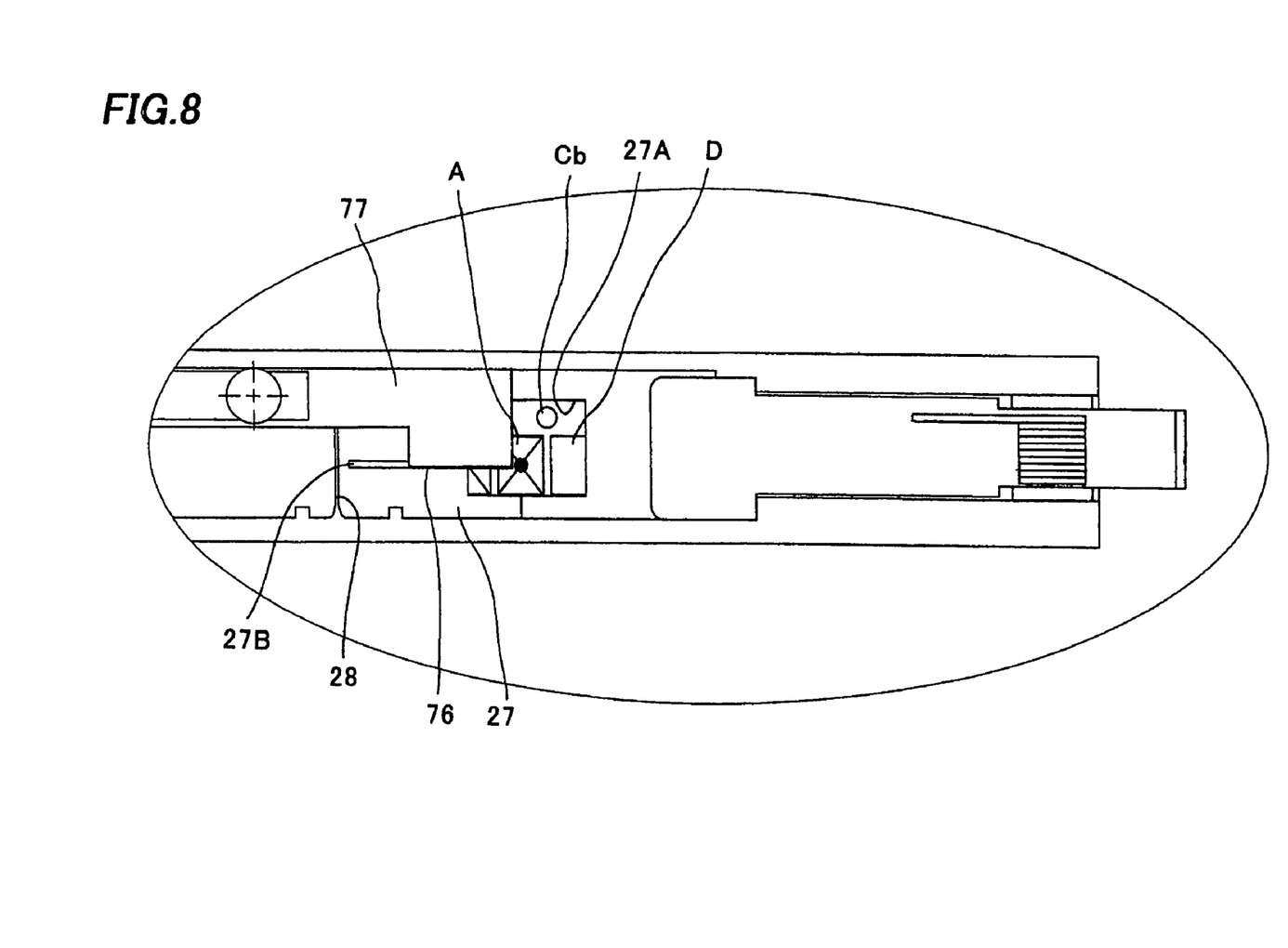
FIG. 8 is a plan view of a main portion of the component feeding unit of FIG. 2 when the shutter is closed.
Figure 9:
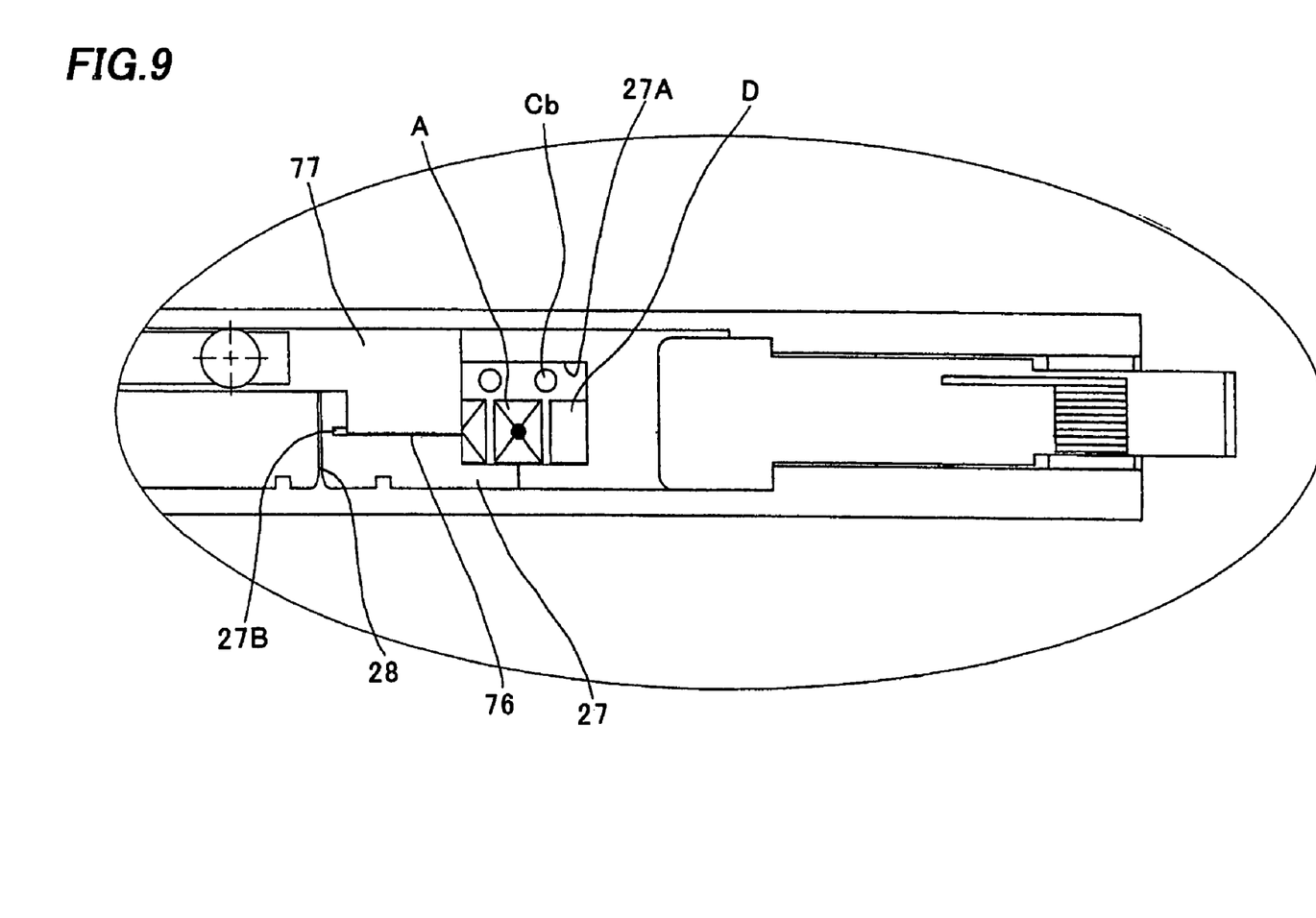
FIG. 9 is a plan view of the main portion of FIG. 8 when the shutter is open.

The storage portion D is formed relatively large to have some room for storing the electronic component. A numeral 66 designates a power supply line for supplying power to the drive motors 32, 42 and 71.

Next, timings of feeding of the storage tape C, peeling of the cover tape Ca, and opening or closing of the shutter 77 will be described. The storage tape C is fed by the tape feeding system 22 by one pitch, and simultaneously with this, the cover tape peeling system 23 intermittently peels the cover tape Ca from the storage tape C by one pitch. Then, as the tape feeding system 22 and the cover tape peeling system 23 stop, the shutter system 24 performs opening operation (FIGS. 8 and 9) to open the shutter 77 above the electronic component A fed to the pickup position.

As the shutter 77 opens, the mounting head 16 picks the electronic component A up. Then, the shutter 77 closes, and simultaneously with this, the next feeding of the storage tape C and the next peeling of the cover tape Ca are performed.

Here, as described above, the component feeding unit 6 can employ four types of the storage tapes C, that is, the storage tapes storing the electronic components aligned at 4 mm pitches, 8 mm pitches, 12 mm pitches and 16 mm pitches. Therefore, the opening 27A for picking in the suppressor 27 is formed in a size corresponding to the electronic component A stored in the storage tape C of 16 mm pitch. Accordingly, the position where the suction nozzle 18 picks up a small electronic component stored in the storage tape C of 4 mm pitch is in a middle of the opening 27A.

A numeral 80 designates a positioning pin provided on each of front and rear sides of a bottom surface of the component feeding unit 6. These positioning pins 80 are inserted in positioning holes (not shown) provided in the base 2 so that the component feeding unit 6 is attached to the electronic component mounting apparatus.

Figure 11:
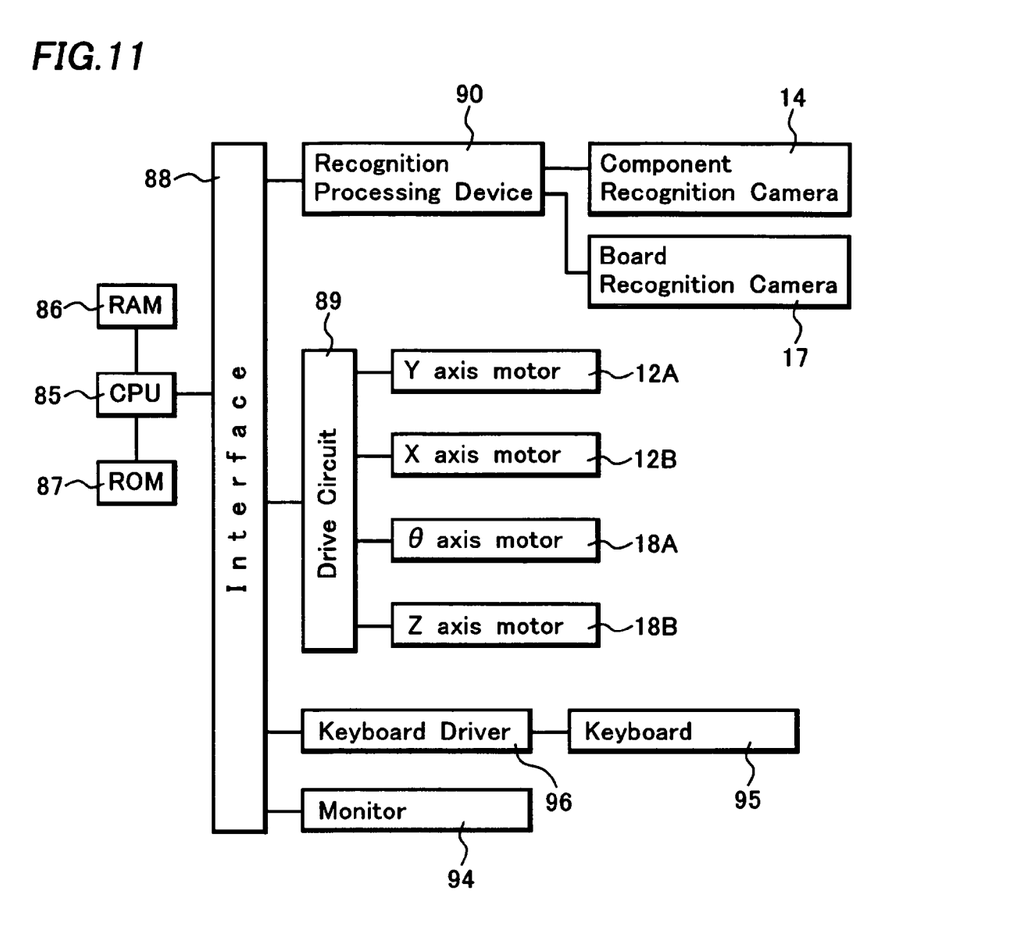
FIG. 11 is a control block diagram of the electronic component mounting apparatus.

Next, a block diagram of a control of the electronic component mounting apparatus of FIG. 11 will be described. A numeral 85 designates a CPU serving as a control device for controlling component picking and mounting operations of the electronic component mounting apparatus 1. A numeral 86 designates an RAM (random access memory) serving as a memory device, and a numeral 87 designates an ROM (read only memory). The CPU 85 controls each of drive sources for the component picking and mounting operations of the electronic component mounting apparatus through an interface 88 and a drive circuit 89 based on data stored in the RAM 86 and according to programs stored in the ROM 87.

The RAM 86 is stored with mounting data including X and Y coordinates and a mounting angle for each of step numbers (in mounting order) and component alignment numbers in the component feeding portion 5, and component data including X and Y sizes for each of the electronic components and numbers of the suction nozzles 18.

A numeral 90 designates a recognition processing device connected with the CPU 85 through the interface 88. The recognition processing device 90 performs recognition processing to images taken and stored by the component recognition camera 14 and the board recognition camera 17, and sends a recognition result to the CPU 85. That is, the CPU 85 outputs a command of performing recognition processing (e.g., calculation of a shifting amount of an electronic component from a normal position) to images taken and stored by the component recognition camera 14 and the board recognition camera 17 to the recognition processing device 90, and receives a recognition processing result from the recognition processing device 90.

That is, when the recognition processing device 90 performs recognition processing and detects a shifting amount from a normal position, this recognition result is sent to the CPU 85. Then, the CPU 85 moves the suction nozzle 18 in X and Y directions by driving the Y axis motor 12A and the X axis motor 12B and rotates the suction nozzle 18 by an angle $\theta$ by driving the $\theta$ axis motor 18A based on the component recognition result and the board recognition result, thereby completing correction of the position of the electronic component in the X and Y directions and the rotating angle along a vertical axis.

Figure 10:
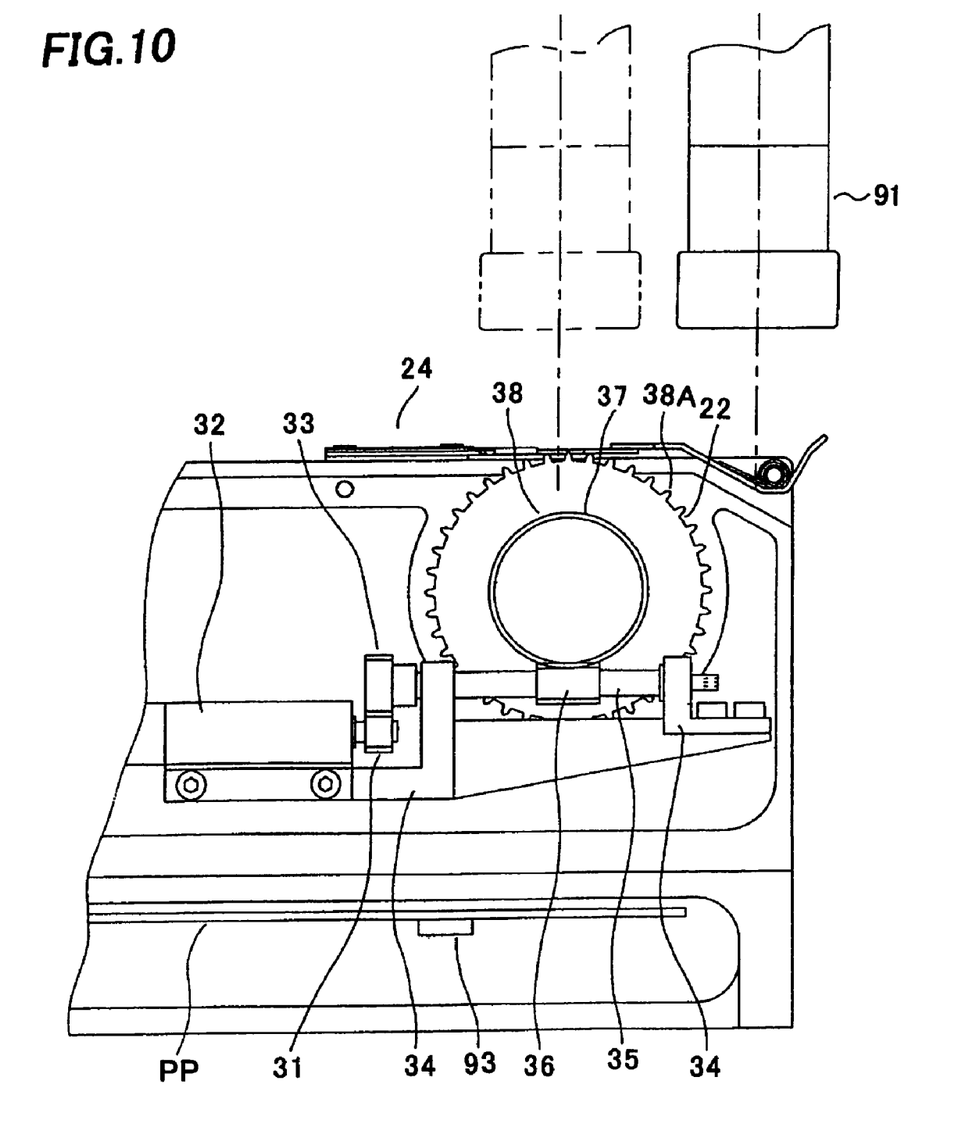
FIG. 10 is a partial side view of the component feeding unit when taking an image of a feeding tooth of a sprocket.

Next, an operation for adjusting the component feeding unit 6 will be described. First, the component feeding unit 6 is fixed to an adjusting jig (not shown). Then, as shown in FIG. 10, a recognition camera 91 moves to a component pickup position corresponding to data previously stored in a storage portion (not shown), and takes an image of each of feeding teeth 38A formed around a sprocket 38. A recognition processing portion, which is the recognition processing device 90, performs recognition processing to the image and calculates a position of each of the feeding teeth 38A.

Figure 12:
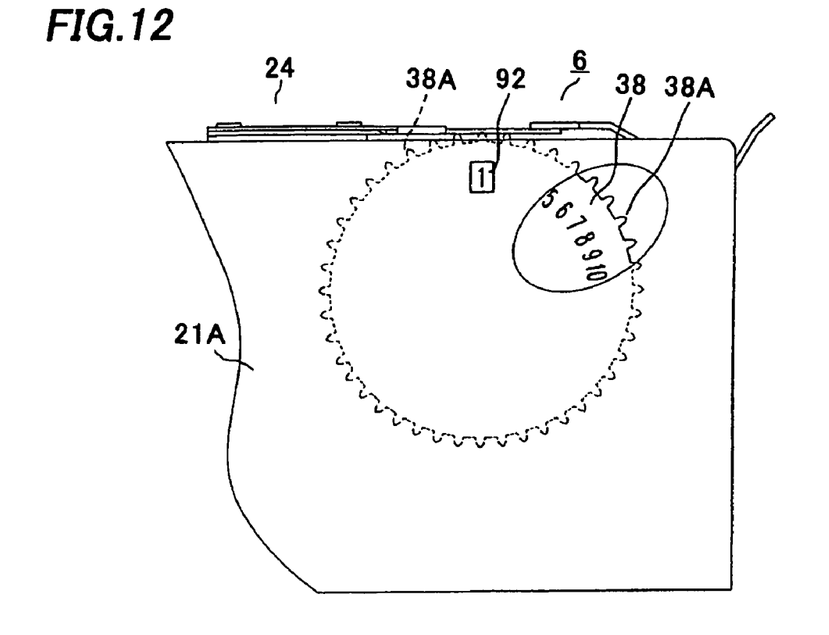
FIG. 12 is a side view of the main portion of the component feeding unit.

In this case, the sprocket 38 is provided with numbers each corresponding to each of the feeding teeth 38A formed therearound. Furthermore, a side wall 21A of a unit frame 21 is provided with a checking window 92 shaped in a rectangle so that an operator can check which one of the feeding teeth 38A is positioned in the position where the electronic component 38A is to be picked up by the suction nozzle (FIG. 12). Therefore, for each of the feeding teeth 38A checked through the checking window 92, that is, for each of the numbers provided for the feeding teeth 38A, positional data of each of the feeding teeth 38A, which are a recognition processing result calculated by the recognition processing portion based on the image of each of the feeding teeth 38A taken by the recognition camera 91, are stored in a memory 93 mounted on a printed board PP in the component feeding unit 6 by using an input device (not shown). In this operation, the positional data of each of the feeding teeth 38A are stored in the memory 93 as the sprocket 38 rotates pitch by pitch under control of a microcomputer (not shown).

This processing is performed to all the feeding teeth 38A of the sprocket 38 in each of all the component feeding units 6 which are to be used for the electronic component mounting apparatus 1.

After the above adjusting operation of the component feeding units 6 is completed, the positioning pins 80 are inserted in positioning holes provided in the base 2 respectively to fix the component feeding units 6 each mounted with the storage tape C to the electronic component mounting apparatus 1.

Then, when a mounting operation of the electronic components is performed, the XY stage 12 is driven to move the head unit 13 to the component feeding unit 6, and the CPU 85 corrects the pickup position of the suction nozzle 18 based on the above-described positional data of the feeding teeth 38A stored in the memory 93. That is, the operator uses the checking window 92 to identify the number corresponding to the feeding tooth 38A of the sprocket 38, which is to be used for the next pickup of the electronic component A, and inputs the number by using a monitor 94 and a keyboard 95 through a keyboard driver 96 to store the number in the RAM 86 in advance. Then, when the suction nozzle 18 picks the electronic component up from the component feeding unit 6 by moving the head unit 13 to the component feeding unit 6 driven by the XY stage 12, the CPU 85 moves the X axis motor 12B and the Y axis motor 12A of the XY stage 12 by an amount to be corrected based on the data on the number of the feeding tooth 38A for next use stored in the RAM 86 and the positional data corresponding to this feeding tooth 38A stored in the memory 93, thereby enabling picking of the electronic component A without fail.

That is, an image of each of the feeding teeth 38A of the sprocket 38 is taken by the recognition camera 91, and the recognition processing portion stores a position in a rotating direction of the sprocket 38, that is, in a moving direction of each of the feeding teeth 38A in the memory 93 as the positional data of each of the teeth 38A which are a recognition processing result calculated by the recognition processing portion. Then, a slight pitch error in the moving direction of each of the feeding teeth 38A is corrected by moving the X axis motor 12B and the Y axis motor 12A of the XY stage 12 by an amount to be corrected based on the positional data corresponding to each of the feeding teeth 38A. This improves accuracy in storage tape feeding and component picking.

Furthermore, a position of each of the feeding teeth 38A in a direction normal to the rotating direction of the sprocket 38 is stored as the positional data of each of the feeding teeth 38A. Then, based on the positional data corresponding to each of the feeding teeth 38A, the X axis motor 12B and the Y axis motor 12A of the XY stage 12 are moved by an amount to be corrected, thereby correcting a positional error of each of the feeding teeth 38A in the direction normal to the rotating direction of the sprocket 38 caused by, for example, slight deformation of the sprocket 38, that is, a slight positional error in the direction normal to the moving direction of each of the feeding teeth 38A. This further improves accuracy in storage tape feeding and component picking.

After the electronic component A is picked up, the XY stage 12 is driven to move the electronic component A to right above the component recognition camera 14 as described above, and the component recognition camera 14 recognizes a posture of the electronic component A and a shifting amount of the electronic component A from a normal position on the suction nozzle 18. Then, the mounting head 16 moves to above the printed board P on the set table 8, and the board recognition camera 17 recognizes the position of the printed board P. Then, the CPU 85 moves the X axis motor 12B and the Y axis motor 12A of the XY stage 12 and the θ axis motor 18A of the suction nozzle 18 by an amount to be corrected based on the recognition result of the recognition processing device 90 based on the image taken by the component recognition camera 14 and the board recognition camera 17, and mounts the electronic component A on the printed board P.

Figure 13:
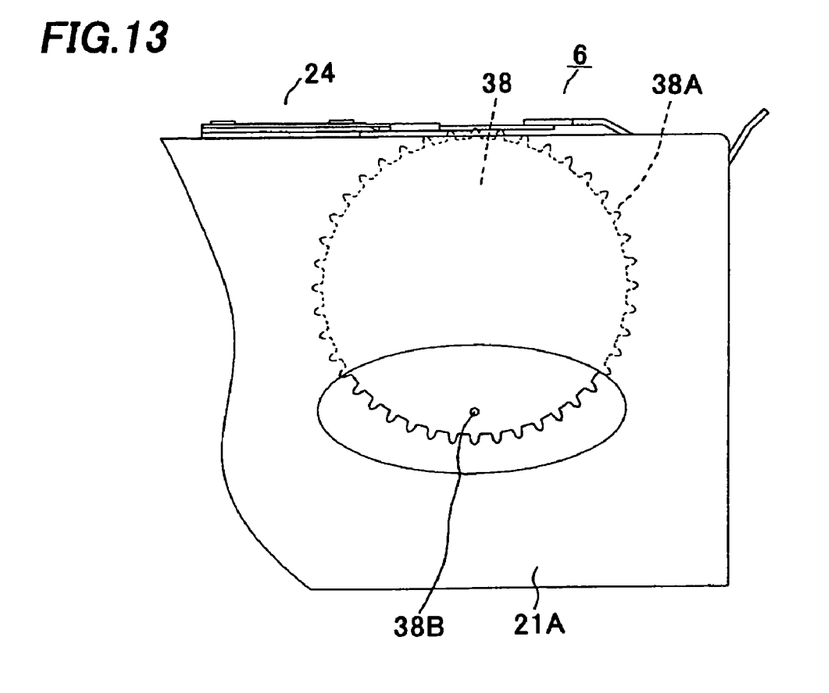
FIG. 13 is a side view of a main portion of a component feeding unit of another embodiment.

Next, a second embodiment will be described based on FIG. 13. As is the case with the first embodiment, the component feeding unit 6 is fixed on the adjusting jig (not shown). Then, the recognition camera 91 takes an image of each of feeding teeth 38A formed around the sprocket 38, and the recognition processing portion performs recognition processing to the image and calculates a position of each of the feeding teeth 38A.

In this case, the sprocket 38 is provided with a starting point checking hole 38B as a mark, corresponding to a certain feeding tooth 38A formed around the sprocket 38. The sprocket 38 rotates pitch by pitch under control of the microcomputer and so on (not shown). Then, when a starting point checking sensor (not shown) recognizes the checking hole 38B, the feeding tooth 38A positioned in the pickup position at this time is set with the number "1." The recognition camera 91 takes an image of this feeding tooth 38A set with the number "1," and positional data of this feeding tooth 38A, which is a recognition processing result by the recognition processing portion, are stored in the memory 93 by using the input device (not shown). Then, the sprocket 38 rotates pitch by pitch and the positional data for each of the feeding teeth 38A are sequentially stored in the memory 93, under control of the microcomputer and so on.

After the above adjusting operation of the component feeding units 6 is completed, in a manner similar to the first embodiment, the component feeding units 6 each mounted with the storage tape C are fixed to the electronic component mounting apparatus 1.

Then, when a mounting operation of the electronic components is performed, the XY stage 12 is driven to move the head unit 13 to the component feeding unit 6, and the CPU 85 corrects the pickup position of the suction nozzle 18 based on the above-described positional data of the feeding tooth 38A stored in the memory 93. That is, the sprocket 38 rotates pitch by pitch in each of the component feeding units 6, and when the starting point checking sensor (not shown) recognizes the starting point checking hole 38B, the feeding tooth 38A positioned in the pickup position at this time is set with the number "1". Then, when the suction nozzle 18 picks: the electronic component up from the component feeding unit 6 by moving the head unit 13 to the component feeding unit 6 by driving the XY stage 12, the CPU 85 moves the X axis motor 12B and the Y axis motor 12A of the XY stage 12 by an amount to be corrected based on the positional data stored in the memory 93, corresponding to the feeding tooth 38A set with the number "1", thereby enabling picking of the electronic component without fail.

That is, in a manner similar to the first embodiment, an image of each of the feeding teeth 38A of the sprocket 38 is taken by the recognition camera 91, and the recognition processing portion stores a position in a rotating direction of the sprocket 38, that is, in a moving direction of each of the feeding teeth 38A in the memory 93 as the positional data of each of the teeth 38A. Then, a slight pitch error in the moving direction of each of the feeding teeth 38A is corrected by moving the X axis motor 12B and the Y axis motor 12A of the XY stage 12 by an amount to be corrected based on the positional data corresponding to each of the feeding teeth 38A. This improves accuracy in component picking.

Furthermore, a position of each of the feeding teeth 38A in a direction normal to the rotating direction of the sprocket 38 is stored in the memory 93 as the positional data of each of the feeding teeth 38A. Then, based on the positional data corresponding to each of the feeding teeth 38A, the X axis motor 12B and the Y axis motor 12A of the XY stage 12 are moved by an amount to be corrected, thereby correcting a slight positional error of each of the feeding teeth 38A in the direction normal to a rotating direction of the sprocket 38 caused by, for example, slight deformation of the sprocket 38. This further improves accuracy in component picking.

After the electronic component A is picked up, the XY stage 12 is driven to move the electronic component A to right above the component recognition camera 14 as described above, and the component recognition camera 14 recognizes a posture of the electronic component A and a shifting amount of the electronic component A from a normal position on the suction nozzle 18. Then, the mounting head 16 moves to above the printed board P on the set table 8, and the board recognition camera 17 recognizes the position of the printed board P. Then, the CPU 85 moves the X axis motor 12B and the Y axis motor 12A of the XY stage 12 and the θ axis motor 18A of the suction nozzle 18 by an amount to be corrected based on the recognition result of the recognition processing device 90 based on the image taken by the component recognition camera 14 and the board recognition camera 17, and mounts the electronic component A on the printed board P.

As described in the above embodiments, the positional data of each of the feeding teeth of the sprocket in the pickup position are stored in the memory so that the suction nozzle can pick the electronic component up without fail by correction based on the positional data.

Note that it is also possible to store the positional data of the feeding teeth along with results of recognition processing of images of indicating marks indicating a position of a feeding tooth positioned in a component pickup position, which replaces the number identification of the feeding teeth. In this case, the same effect as above can be obtained by recognizing the marks provided on the sprocket itself corresponding to each of the feeding teeth. Furthermore, the marks corresponding to the feeding teeth can be provided on a master tape for recognition.

Although the multifunctional chip mounter is used as an example of the electronic component mounting apparatus in this embodiment, the embodiment is not limited to this but can be applied to a high speed chip mounter of rotary table type.

Although particular preferred embodiments of the invention have been disclosed in detail, it will be recognized that variations or modifications of the disclosed apparatus are possible based on the disclosure to those skilled in the art and lie within the scope of this invention.

It is also possible to provide the electronic component feeding device, which is detachable from the electronic component mounting apparatus, with a recognition unit having the recognition camera and the recognition processing device so that the positional data is stored in the memory of the electronic component feeding device by this recognition unit.

What is claimed is:

1. An electronic component mounting apparatus comprising:
    an electronic component feeding device feeding an electronic component to a component feeding position, and comprising a sprocket which intermittently rotates so that a plurality of feeding teeth provided at a peripheral portion thereof engage sequentially with a plurality of feeding holes provided in a storage tape storing the electronic component therein, a plurality of marks being provided on a side face of the sprocket and corresponding to the feeding teeth;
    a memory storing positional data of the feeding teeth resting at the component feeding position in association with feeding tooth identification data based on the marks so as to correlate each of the feeding teeth to a corresponding portion of the positional data;
    a control device correcting a position where the electronic component is picked up by a suction nozzle based on the positional data and the feeding tooth identification data;
    a checking window formed in a frame supporting the sprocket, through which the marks are recognized; and
    a human-interface input device inputting the feeding tooth identification data based on the marks recognized through the checking window for storing in association with the positional data.

2. The electronic component mounting apparatus of claim 1, further comprising a recognition camera taking images of the feeding teeth resting at the component feeding position, and a recognition processing device generating the positional data by performing recognition processing to the images of the feeding teeth taken by the recognition camera.

* * * * *